United States Patent
Huang et al.

(10) Patent No.: US 11,588,473 B1
(45) Date of Patent: Feb. 21, 2023

(54) CIRCUIT WITH METAL-OXIDE SEMICONDUCTOR FIELD-EFFECT TRANSISTOR AND DIODE MODULE AND IMPLEMETATION METHOD THEREOF

(71) Applicant: Potens Semiconductor Corp., Zhubei (TW)

(72) Inventors: Wen Nan Huang, Zhubei (TW); Ching Kuo Chen, Zhubei (TW); Chih Ming Yu, Zhubei (TW); Hsiang Chi Meng, Hsinchu County (TW)

(73) Assignee: POTENS SEMICONDUCTOR CORP., Zhubei (TW)

( * ) Notice: Subject to any disclaimer, the term of this patent is extended or adjusted under 35 U.S.C. 154(b) by 0 days.

(21) Appl. No.: 17/533,605

(22) Filed: Nov. 23, 2021

(30) Foreign Application Priority Data

Aug. 3, 2021 (TW) .................................. 110128604

(51) Int. Cl.
*H03K 3/011* (2006.01)
*H02M 1/42* (2007.01)

(52) U.S. Cl.
CPC .............. *H03K 3/011* (2013.01); *H02M 1/42* (2013.01)

(58) Field of Classification Search
CPC .................................. H03K 3/011; H02M 1/42

USPC .................................................... 327/108–112
See application file for complete search history.

(56) References Cited

U.S. PATENT DOCUMENTS

2014/0340124 A1* 11/2014 Hirler .................. H03K 17/168
327/108

* cited by examiner

*Primary Examiner* — Tomi Skibinski
(74) *Attorney, Agent, or Firm* — Muncy, Geissler, Olds & Lowe, P.C.

(57) ABSTRACT

A circuit with a metal-oxide semiconductor field-effect transistor and a diode module is applied to a power factor correction circuit, which can effectively reduce the heat generated by the whole system under heavy load. The circuit includes a metal-oxide semiconductor field-effect transistor and a diode module and a load determination unit. The diode module includes a plurality of diodes with a switch. The load determination unit can control the connection/disconnection of each diode in the diode module based on the magnitude of the load current. It can effectively reduce the current generated by each diode due to the load, thereby reducing the heat generation of the overall system. Moreover, due to the contact capacitance effect after the diodes are connected in parallel, the electromagnetic interference (EMI) characteristics of the power factor correction circuit of the system can be further optimized.

7 Claims, 6 Drawing Sheets

| Magnitude of the load current | 1A | 2A | 3A | 4A | 5A |
|---|---|---|---|---|---|
| Amount of the switched-on diodes | 1 | 2 | 3 | 4 | 5 |

FIG.6

CIRCUIT WITH METAL-OXIDE SEMICONDUCTOR FIELD-EFFECT TRANSISTOR AND DIODE MODULE AND IMPLEMETATION METHOD THEREOF

BACKGROUND OF INVENTION

(1) Field of the Present Disclosure

The present disclosure relates to a circuit, and more particularly to a circuit with a metal-oxide semiconductor field-effect transistor and a diode module that can effectively reduce the temperature of the overall module and optimize electromagnetic interference.

(2) Brief Description of Related Art

Mains electricity, also known by the American English terms utility power, power grid, domestic power, and wall power, is a general-purpose alternating-current (AC) electric power supply. However, the loads of most electronic devices are designed for direct current. Therefore, when using a DC load, it is necessary to convert AC power to DC power. This type of circuit is also called AC/DC converter. There are different laws and regulations on the use of utility power in different countries. Basically, loads above 60~75 W will require PF (Power Factor) to be greater than 0.9. There are many electrical products (loads) whose power factor is very low due to the characteristics of internal impedance. If the power factor is lower than 0.9, it is necessary to install a power factor correction circuit at the power input terminal in order to improve the power factor of the electrical product (load). On the one hand, it can increase the energy of the power supply. On the other hand, it can increase the power factor or efficiency of electrical products (loads), so as to effectively solve the problem.

Referring to FIG. 1, the operating principle of a boost circuit 1 is as follows. First, when a metal-oxide semiconductor field-effect transistor 11 is switched on (ON), one end of an inductor 12 is grounded. The inductor 12 is charged by an input voltage. The voltage at both ends is equivalent to the input voltage. The inductor current rises linearly. When the metal-oxide semiconductor field-effect transistor 11 is switched off (OFF), the voltage of the inductor 12 is reversed such that the inductor 12 supplies power to the load through a diode 13. The boost circuit is often used as a power factor correction circuit. However, in facing a heavy load, the circuit creates much heat on a die due to the large current, which will easily cause problems such as overheating of the load or poor operating environment. In addition, electromagnetic interference (EMI) problems often occur when the circuit is energized. Accordingly, the problem how to effectively reduce the heat generation of the circuit and optimize the electromagnetic interference (EMI) characteristics needs to be resolved.

SUMMARY OF INVENTION

It is a primary object of the present disclosure to provide a circuit with a metal-oxide semiconductor field-effect transistor and a diode module that can effectively reduce the heat of the circuit and optimize the electromagnetic interference.

According to the present disclosure, a circuit with a metal-oxide semiconductor field-effect transistor and a diode module includes a metal-oxide semiconductor field-effect transistor, a diode module, and a load determination unit. The diode module includes a plurality of diodes connected in parallel and each having a switch. In use, when the metal-oxide semiconductor field-effect transistor is cut-off, a load current will flow through the load determination unit and the diode module. The load determination unit controls each switch of the diode module based on the load current. When the load is heavy, more than two diodes of the diode module are switched on, so that the current flowing through a single diode can be reduced, thereby reducing the heal generation of the overall system. In addition, because of the contact capacitance effect after the diodes are connected in parallel, it can further optimize the electromagnetic interference (EMI) characteristics of the power factor correction circuit (Power Factor Correction) of the system.

BRIEF DESCRIPTION OF THE DRAWINGS

FIG. 6 is a memory look-up table of the present disclosure.

DETAILED DESCRIPTION OF PREFERRED EMBODIMENTS

Figure 1:
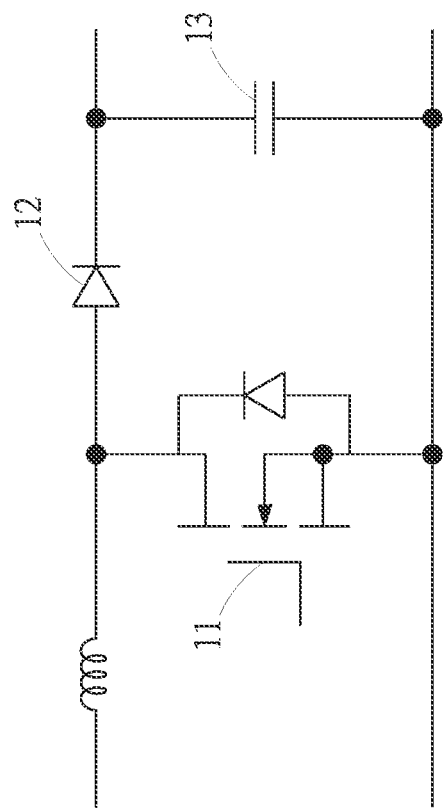
FIG. 1 is a diagram of a conventional boost circuit.
Figure 2:
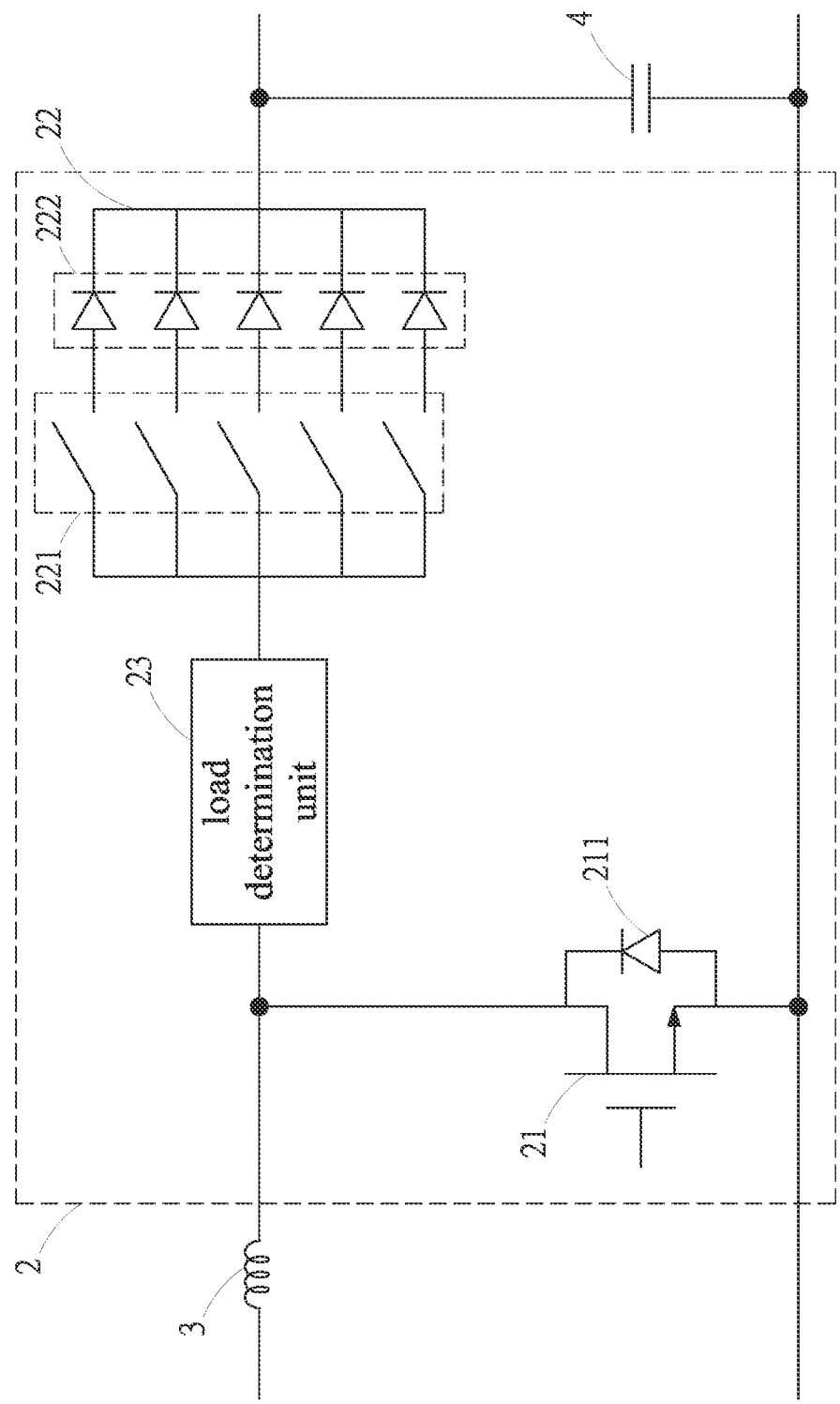
FIG. 2 is a circuit block diagram according to the present disclosure.

Referring to FIG. 2, a circuit 2 with a metal-oxide semiconductor field-effect transistor and a diode module includes a metal-oxide semiconductor field-effect transistor 21, a diode module 22, and a load determination unit 23. The circuit 2 is applied to a power factor correction conversion circuit, which can be a boost circuit with an inductor 3 and an output capacitor 4. Each component is described and exemplified as follows:

The metal-oxide semiconductor field-effect transistor 21 includes a diode 211 connected in parallel. The metal-oxide semiconductor field-effect transistor 21 is electrically connected to the inductor 3. The power factor correction can be achieved by switching on/off the metal-oxide semiconductor field-effect transistor 21.

Both ends of the diode module 22 are electrically connected to the load determination unit 23 and the output capacitor 4, respectively. The diode module 22 includes a plurality of diodes 222 with a switch 221. Each switch 221 is controlled by the load determination unit 23. According to different magnitude of the load, each diode 222 can be selected for switching-on to effectively reduce the heat generation of the overall module. Optionally, each diode 222 can be a diode of the same specification. Also, it can be diodes of different specifications.

Both ends of the load determination unit 23 are electrically connected to the inductor 3 and the diode module 22 respectively. The load determination unit 23 is provided for receiving a load current and controlling each switch 221 based on the load current, such that each diode 222 is switched on or off. Preferably, the load determination unit 23 stores a memory look-up table 231. The load determination unit 23 control switch 221 to select diodes which should be switched on or off according to the memory look-up table 231 after receiving the load current.

Figure 3:
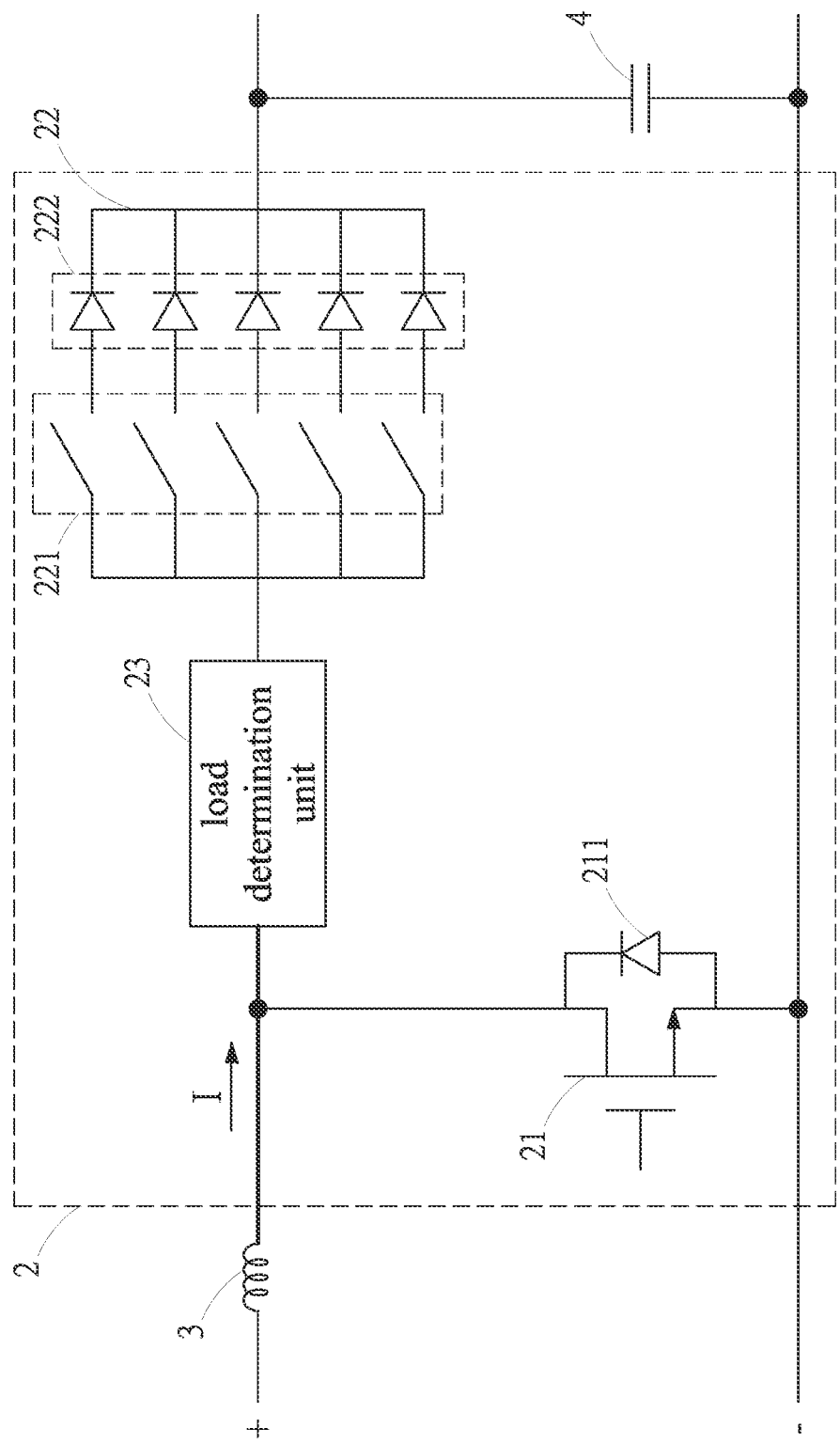
FIG. 3 is an implementation view I of the present disclosure.

Referring to FIG. 3, when the present disclosure is implemented, the metal-oxide semiconductor field-effect transistor 21 is switched on/off to perform the power factor correction. When the metal-oxide semiconductor field-effect transistor 21 is switched off, the load current. I flows through the diode module 22 and the load determination unit 23. At this time, the load determination unit 23 controls the switching-on/off of each switch 221 of the diode module 22 based on the magnitude of the load current I. In this way, each diode 222 has different conduction combinations according to different loads.

Figure 4:
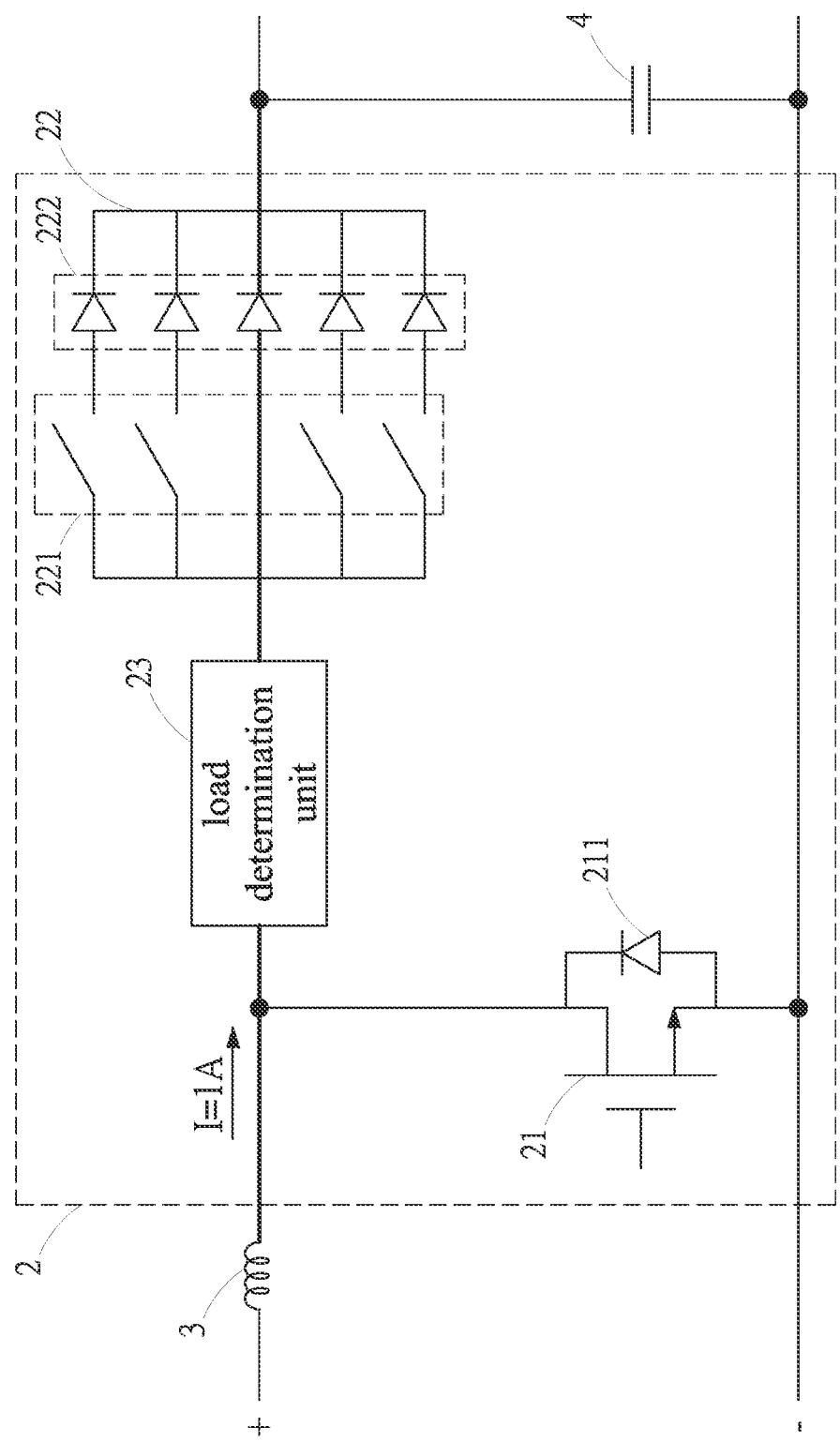
FIG. 4 is an implementation view II of the present disclosure.

Referring to FIG. 4, when the circuit of the present disclosure is operated with light load, the load determination unit 23 receives a smaller load current I. At this time, the diode module 22 can be controlled to switch-on a single, fewer, or smaller-sized diode 222 to reduce the loss on the circuit. As shown in the drawing, the load current I=1A is taken as an example of a light load. At this time, the load determination unit 23 selects only a group of switches 221 in the diode module 22 to form a closed-circuit to reduce loss.

Figure 5:
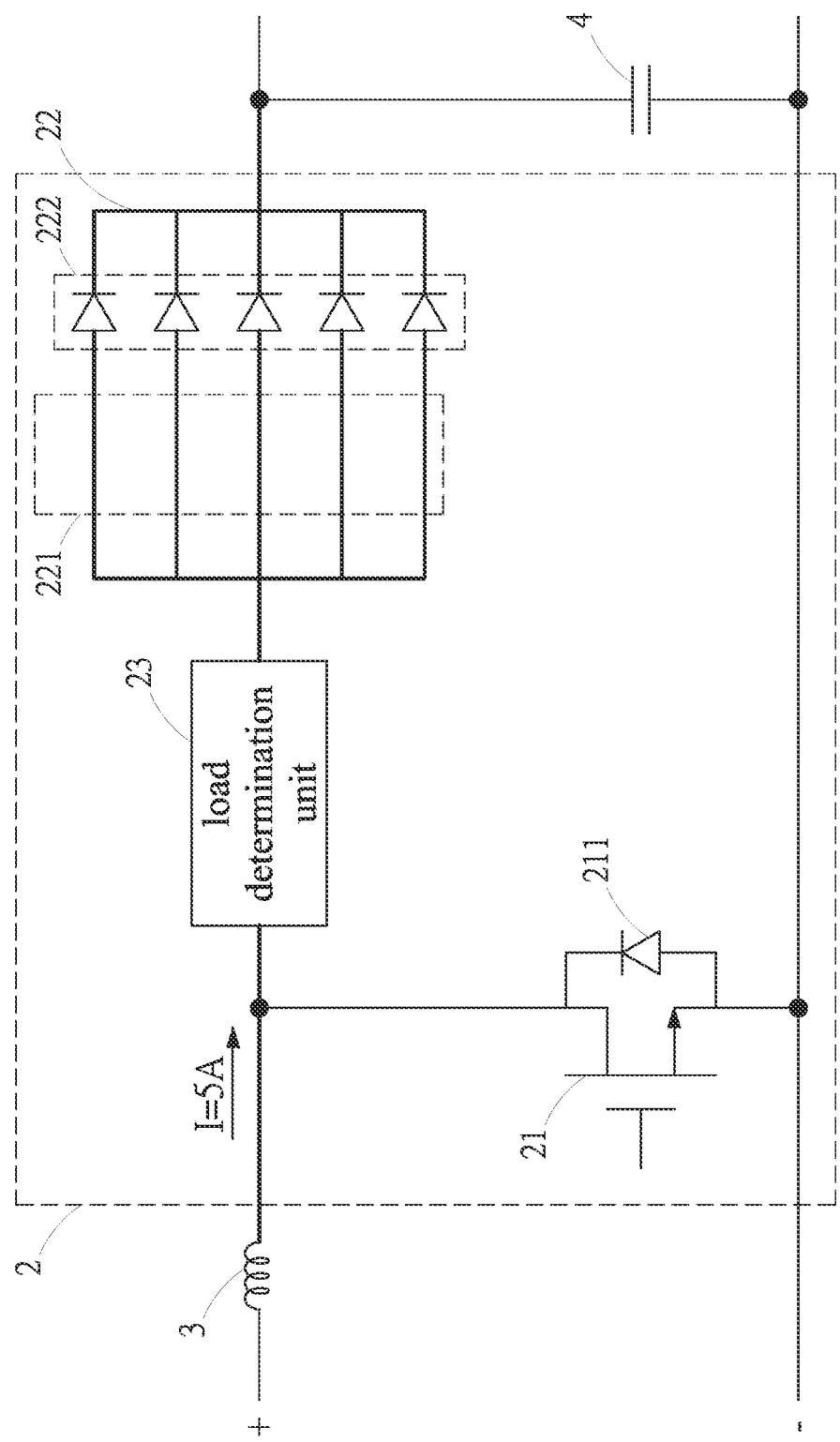
FIG. 5 is an implementation view III of the present disclosure.

Referring to FIG. 5, when the circuit of the present disclosure is operated with heavy load, the load determination unit 23 receives a larger load current. I. At this time, the diode module 22 can be controlled to switch-on more or larger-sized diodes 222 to reduce the high heat generated by the circuit. As shown in the drawing, the load current I=5A is taken as an example of a heavy load. At this time, the load determination unit 23 selects five groups of switches 221 in the diode module 22 to form a closed-circuit conduction. By reducing the current flowing through each diode 222, the purpose of effectively reducing the heat generated by the circuit can be achieved. Moreover, the contact capacitance effect takes place after the diodes 222 are connected in parallel under heavy load. As a result, the electromagnetic interference (EMI) characteristics of the power factor correction circuit of the system can be further optimized.

Referring to FIG. 6, a memory look-up table 231 is stored in the load determination unit 23. The load determination unit 23 selects a best conduction combination of the diode module 22 for different load current I. However, the conduction combination of the diode module 22 is not necessarily linearly related to the conduction number of the diodes 222 with respect to the magnitude of the load current I. When the diodes 222 are not of the same specification, it is not possible to determine the conduction of the diodes 222 in a purely linear manner based on the load current I. Therefore, the built-in memory look-up table 231 of the load determination unit 23 can assist the load determination unit 23 to adjust the conduction combination of the diode module 22 to achieve the best effect of reducing the heat generation of the circuit.

According to the present disclosure, the circuit with a metal-oxide semiconductor field-effect transistor and a diode module can be applied to a power factor correction circuit and includes a metal-oxide semiconductor field-effect transistor, a diode module, and a load determination unit. The diode module includes a plurality of diodes with a switch. Each diode can be of the same specification or different specifications. When the present disclosure is connected to a load, the metal-oxide semiconductor field-effect transistor will be switched on/off to perform power factor correction. When the metal-oxide semiconductor field-effect transistor is switched off, the load current flows through the diode module and the load determination unit. Based on the load current, the load determination unit controls the switches of the diode module in such a way that each diode enters into a closed-circuit state or an open-circuit state. Under heavy load, conduction of at least two, more, or larger size diodes can reduce the current flowing through each diode, thereby minimizing heat generated by the circuit. In addition, because the contact capacitance effect is created after each diode 222 is connected in parallel, it can further optimize the electromagnetic interference (EMI) characteristics of the power factor correction circuit of the system.

REFERENCE SIGN 1 boost circuit
11 metal-oxide semiconductor field-effect transistor
12 inductor
13 diode
2 circuit with a metal-oxide semiconductor field-effect transistor and a diode module
21 metal-oxide semiconductor field-effect transistor
211 diode
22 diode module
221 switch
222 diode
23 load determination unit
231 memory look-up table
I load current

What is claimed is:

1. A circuit with metal-oxide semiconductor field-effect transistor and diode module, applied to a power factor correction conversion circuit for correcting a power factor when a load is connected, comprising:
    a metal-oxide semiconductor field-effect transistor;
    an inductor outputting a different load current according to the load to the load;
    a diode module having a plurality of diodes each provided with a switch, and the diodes being electrically connected in parallel; and
    a load determination unit electrically connected to the metal-oxide semiconductor field-effect transistor, the inductor, and the diode module for receiving the load current, and controlling the switch based on the load current in such a way that each diode is in a closed-circuit state or an open-circuit state, in order to distribute the load current flowing through each of the diodes when the load is heavy,
    wherein, the load determination unit, the diode module, and the inductor are connected in series, and the load determination unit is connected in series between the diode module and the inductor.

2. The circuit with metal-oxide semiconductor field-effect transistor and diode module as claimed in claim 1, wherein the load determination unit includes a memory look-up table, and wherein the load determination unit controls the switch based on the load current and the memory look-up table.

3. The circuit with metal-oxide semiconductor field-effect transistor and diode module as claimed in claim 1, wherein the diodes have the same specifications or different specifications.

4. An implementation method of a circuit with metal-oxide semiconductor field-effect transistor and diode module applied to a power factor correction conversion circuit, for correcting a power factor when a load is connected, comprising:
    when a metal-oxide semiconductor field-effect transistor is switched off, a load current is output from an inductor according to the load and flows through a diode module and a load determination unit that are connected in series with the inductor, and wherein, based on the load current, the load determination unit controls each switch of the diode module in such a way that each diode is in a closed-circuit state or an open-circuit state, in order to distribute the load current flowing through each diodes in the diode module when the load is heavy.

5. The implementation method of the circuit with metal-oxide semiconductor field-effect transistor and diode module as claimed in claim 4, wherein the load determination unit controls the switch based on the load current and a memory look-up table.

6. The implementation method of the circuit with metal-oxide semiconductor field-effect transistor and diode module as claimed in claim 4, wherein the diodes have the same specifications or different specifications.

7. The implementation method of the circuit with metal-oxide semiconductor field-effect transistor and diode module as claimed in claim 4, wherein, when the load is a heavy load, the switch is controlled by the load determination unit in such a way that at least two diodes are switched on.

* * * * *